United States Patent
Lin

(10) Patent No.: US 7,903,762 B2
(45) Date of Patent: Mar. 8, 2011

(54) MULTI-BAND TV TUNER AND METHOD THEREOF

(75) Inventor: Chia-Liang Lin, Union City, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 1058 days.

(21) Appl. No.: 11/668,470

(22) Filed: Jan. 30, 2007

(65) Prior Publication Data

US 2007/0268961 A1 Nov. 22, 2007

Related U.S. Application Data

(63) Continuation-in-part of application No. 11/419,507, filed on May 21, 2006, now Pat. No. 7,620,381.

(51) Int. Cl.
*H04L 27/00* (2006.01)

(52) U.S. Cl. ......... 375/324; 455/118; 455/313; 455/314; 455/315; 455/316; 455/317; 455/318; 455/319; 455/320; 455/321; 455/322; 455/323; 455/324; 455/325; 455/326; 455/327; 455/328; 455/329; 455/330; 455/331; 455/332; 455/333; 455/334

(58) Field of Classification Search .................. 375/324; 455/118, 313–334
See application file for complete search history.

(56) References Cited

U.S. PATENT DOCUMENTS

| | | | |
|---|---|---|---|
| 4,468,784 A * | 8/1984 | Jagnow et al. | 375/150 |
| 4,628,270 A * | 12/1986 | Roberts | 329/360 |
| 5,697,091 A | 12/1997 | Hirschenberger | |
| 6,041,223 A | 3/2000 | Thomas | |
| 6,642,874 B1 | 11/2003 | Lin et al. | |
| 6,845,233 B2 | 1/2005 | Louis | |
| 6,933,766 B2 | 8/2005 | Khlat | |
| 7,130,604 B1 | 10/2006 | Wong | |
| 7,190,943 B2 | 3/2007 | Davis | |
| 7,457,606 B2 | 11/2008 | Kim | |
| 7,471,134 B2 | 12/2008 | Dornbusch | |
| 2004/0120422 A1 | 6/2004 | Lin et al. | |
| 2005/0233723 A1 | 10/2005 | Gomez | |
| 2005/0239430 A1 | 10/2005 | Shah | |
| 2005/0271173 A1 | 12/2005 | Chou et al. | |
| 2006/0160518 A1 | 7/2006 | Seendripu | |

OTHER PUBLICATIONS

Taiwan Office Action dated Nov. 16, 2010, A9900392.474.

* cited by examiner

*Primary Examiner* — David C. Payne
*Assistant Examiner* — Nader Bolourchi
(74) *Attorney, Agent, or Firm* — Thomas, Kayden, Horstemeyer & Risley, LLP

(57) ABSTRACT

A direct conversion multi-band TV tuner includes: a plurality of RF (radio frequency) paths for processing the RF signal and for generating a plurality of processed RF signals, respectively; and a TSC (tri-state chopper) based quadrature frequency converter for receiving one of said processed RF signals and converting the received processed RF signal into a in-phase baseband signal and a quadrature baseband signals; wherein the TSC based quadrature frequency converter operates in accordance with a first set of periodic three-state control signals and a second set of periodic three-state control signals that are approximately 90 degrees offset from the first set of periodic three-state control signals.

10 Claims, 13 Drawing Sheets waveform of $G_1*M_1+G_2*M2+G_3*M_3$ (B)

waveform of $G_1*M_1+G_2*M2+G_3*M_3$ (B)

US 7,903,762 B2

MULTI-BAND TV TUNER AND METHOD THEREOF

RELATED APPLICATION

This application is a continuation-in-part of co-pending application Ser. No. 11/419,507, filed on May 21, 2006, having the title "Tri-state chopper for frequency conversion."

BACKGROUND OF THE INVENTION

1. Field of the Invention

The present invention relates to television tuners, in particular to a television tuner using direct conversion.

2. Description of Related Art

Direct conversion receivers are well known in the prior art. FIG. 1 depicts a functional block diagram of a typical direct conversion receiver 100, which comprises: a pre-filter 110; a LNA (low-noise amplifier) 120; an in-phase (I) path comprising a first mixer 130_I, a first LPF (low pass filter) 140_I, and a first ADC (analog-digital converter) 150_I; and a quadrature (Q) path comprising a second mixer 130_Q, a second LPF (low pass filter) 140_Q, and a second ADC (analog-digital converter) 150_Q. Pre-filter 110 performs a preliminary filtering on a RF (radio frequency) input RF_IN and passes an output to LNA 120, which performs a low-noise amplification on the output of pre-filter 110 and generates a RF signal 122 provided as an input to both the in-phase (I) path and the quadrature (Q) path. The in-phase path receives the RF signal 122 and converts it into a first digital baseband signal BB_I by mixing the RF signal 122 with an in-phase clock LO_I using mixer 130_I, filtering an output of mixer 130_I using LPF 140_I, and converting the output of LPF 140_I into the digital baseband signal BB_I using ADC 150_I. The quadrature path receives the RF signal 122 and converts it into a second digital baseband signal BB_Q by mixing the RF signal 122 with a quadrature clock LO_Q using mixer 130_Q, filtering an output of mixer 130_Q using LPF 140_Q, and converting the output of LPF 140_Q into the digital baseband signal BB_Q using ADC 150_Q. In general, the input signal RF_IN is a wide-band signal that contains many spectral components, among which only a narrow-band component is to be selected. To satisfy the condition of "direct conversion," both the in-phase clock LO_I and the quadrature clock LO_Q must have the same frequency as the desired narrow-band component, and also the phase difference between the in-phase clock LO_I and the quadrature clock LO_Q must be 90 degrees.

Although the principle of direct conversion receiver has been well known in prior art, it is very difficult to apply direct conversion to a TV tuner due to a problem known as "harmonic mixing" caused by an undesired but inevitable mixing within the two mixers (130_I and 130_Q). In particular, a practical mixer is subject to generating spurious mixing products among its input RF signal and odd-order harmonics of the LO clock. For instance, a tuner needs to be tuned to select a channel among a plurality of channels ranging from 47 MHz to 862 MHz. If the tuner were tuned to 100 MHz using direct conversion architecture, both LO clocks (LO_I and LO_Q) must also be 100 MHz in frequency. While the desired channel (at 100 MHz) can be successfully converted into the two baseband signals, the signal of an undesired channel at 300 MHz will also be converted and become a part of the two baseband signals, since the undesired signal at 300 MHz will also be mixed with the 3 harmonics of the LO signals. A mixer can be implemented either as a "multiplying mixer" or a "switching mixer"; neither is immune from the "harmonic mixing" problem.

What is needed is a method and an apparatus for alleviating harmonics mixing for a direct conversion TV tuner.

BRIEF SUMMARY OF THIS INVENTION

In an embodiment, a receiver for receiving an RF (radio frequency) signal is disclosed, the receiver including: a plurality of RF paths for processing the RF signal and for generating a plurality of processed RF signals, respectively; and a quadrature frequency converter for receiving one of said processed RF signals and converting the received processed RF signal into a in-phase baseband signal and a quadrature baseband signals; wherein the quadrature frequency converter operates in accordance with a first set of periodic control signals and a second set of periodic control signals that are approximately 90 degrees offset from the first set of periodic control signals.

In an embodiment, a method is provided for receiving a RF (radio frequency) signal, the method comprising: processing the RF signal using a plurality of RF processing paths of distinct frequency responses to generate a plurality of processed RF signals; selecting a processed RF signal among said processed RF signals; and converting the selected processed RF signal into an in-phase baseband signal and a quadrature baseband signal using a quadrature frequency converter; wherein the quadrature frequency converter performs the converting using a set of periodic in-phase control signals and a set of periodic quadrature control signals that are approximately 90 degrees offset from the set of periodic in-phase control signals.

In an embodiment, a method for receiving an RF (radio frequency) signal is disclosed, the method comprising: processing the RF signal using a plurality of RF processing paths of distinct frequency responses to generate a plurality of processed RF signals; selecting a processed RF signal among said processed RF signals; and converting the selected processed RF signal into an in-phase baseband signal and a quadrature baseband signal using a quadrature frequency converter; wherein the quadrature frequency converter performs the converting using a set of periodic in-phase control signals and a set of periodic quadrature control signals that are approximately 90 degrees offset from the set of periodic in-phase control signals.

BRIEF DESCRIPTION OF THE DRAWINGS

FIG. 12A shows a multi-band direct conversion receiver using a TSC based quadrature frequency converter and a quadrature mixer.

FIG. 12A shows an alternative multi-band direct conversion receiver using a TSC based quadrature frequency converter and a quadrature mixer.

DETAILED DESCRIPTION OF THIS INVENTION

Figure 1:
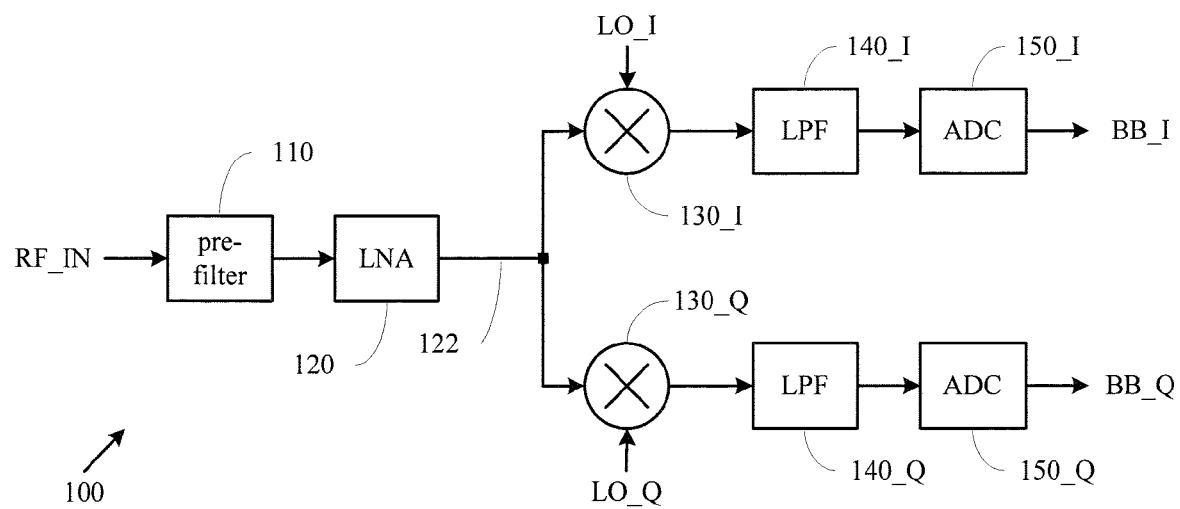
FIG. 1 shows a block diagram of a prior art direct conversion receiver.

The present invention relates to a direct conversion receiver. While the specifications described several example embodiments of the invention considered best modes of practicing the invention, it should be understood that the invention can be implemented in many way and is not limited to the particular examples described below or to the particular manner in which any features of such examples are implemented. In other instances, well-known details are not shown or described to avoid obscuring aspects of the invention.

Tri-State Chopper

As disclosed in the co-pending application "Tri-state chopper for frequency conversion," a tri-state chopper (TSC) receives an input signal and a three-state control signal and generates an output signal.

Throughout this disclosure, by way of example but not limitation, two control signals SN ("sign") and ZR ("zero") are used to represent a three-state control signal for controlling a TSC circuit. When SN is high and ZR is low, the output signal is proportional to the input signal. When SN is low and also ZR is low, the output signal is proportional to an inversion of the input signal. When ZR is high, the output signal is zero regardless of the input signal. For detailed description of TSC, please refer to the co-pending application.

Tri-State Chopper Based Frequency Conversion

A TSC circuit can be used as a frequency converter when the control signal is periodic, i.e. both SN and ZR are periodic. In particular, when SN has a period of T and ZR has a period of half of T, one can effectively synthesize a MLT-3 (multi-level transmit, 3-level) wave that can be tailored to have a selective harmonics rejection by properly choosing a duty cycle factor for ZR. To further improve the performance of harmonics rejection, one can construct a frequency converter by first using a plurality of TSC circuits along with a plurality of periodic control signals of varying timing offsets to generate a plurality of conversion signals from a common input signal and then performing a weighted sum on said plurality of conversion signals. For a more detailed description of TSC-based frequency conversion, please refer to the co-pending application.

Borrowing the convention used in the co-pending application, one characterizes a MLT-3 waveform synthesized from using a periodic three-state control signal of period T by three parameters: $T_1$, $T_0$, and $T_{-1}$. $T_1$ is the duration each time the MLT-3 wave stays at "1" (i.e. SN is high and ZR is low). $T_{-1}$ is the duration each time the MLT-3 wave stays at "-1" (i.e. SN is low and ZR is low). $T_0$ is the duration each time the MLT-3 wave stays at "0" (i.e. ZR is high).

In the co-pending application, a special case of MLT-3 waveform where $T_1/T=\frac{1}{3}$, $T_{-1}/T=\frac{1}{3}$, and $T_0/T=\frac{1}{6}$ is disclosed; a frequency converter based on using a weighted sum of three such MLT-3 waves of proper timing offsets is capable of rejecting up to the $9^{th}$ order harmonics mixing. For some applications, it is acceptable to reduce circuit complexity at the cost of a poorer performance of rejection of harmonics mixings.

Consider another interesting case where $T_1/T=\frac{3}{8}$, $T_{-1}/T=\frac{3}{8}$, and $T_0/T=\frac{1}{8}$, the MLT-3 wave can be represented by the following Fourier series:

$$MLT3(t) = \frac{4\cos(\pi/8)}{\pi} \cdot \sin(\omega t) + \frac{4\cos(3\pi/8)}{3\pi} \cdot \sin(3\omega t) - \frac{4\cos(3\pi/8)}{5\pi} \cdot \sin(5\omega t) + \ldots$$

Figure 5A:
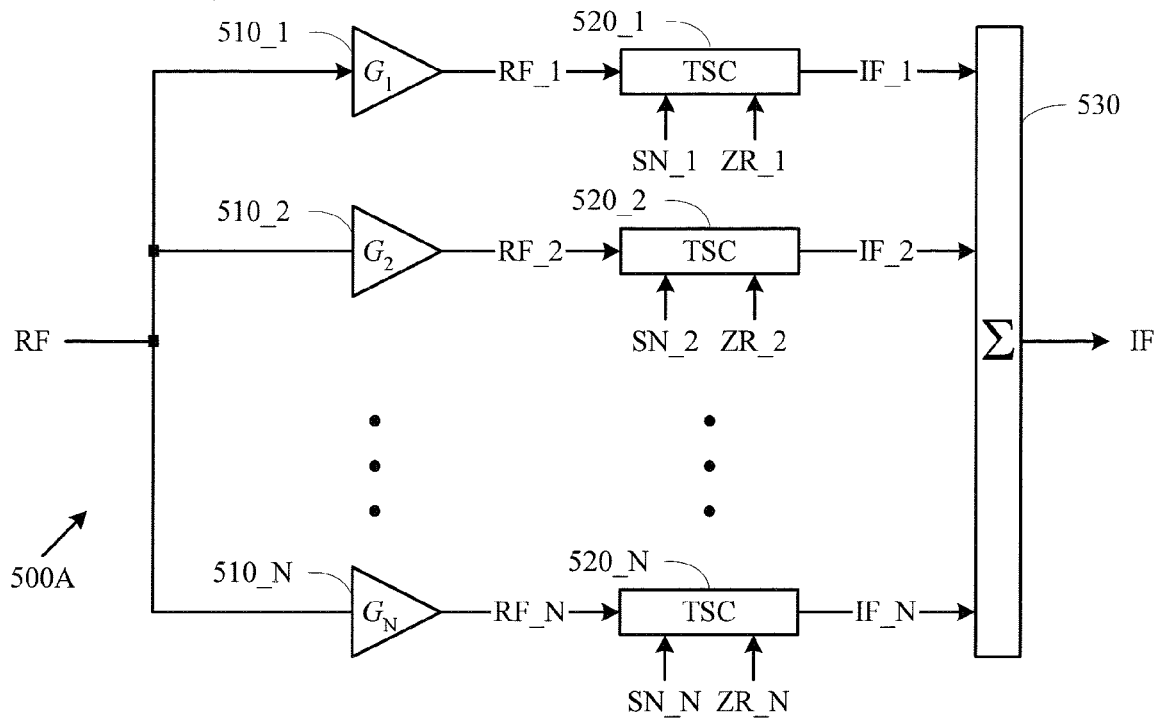
FIG. 5A shows an embodiment of a frequency converter using a plurality of TSC circuits.
Figure 5B:
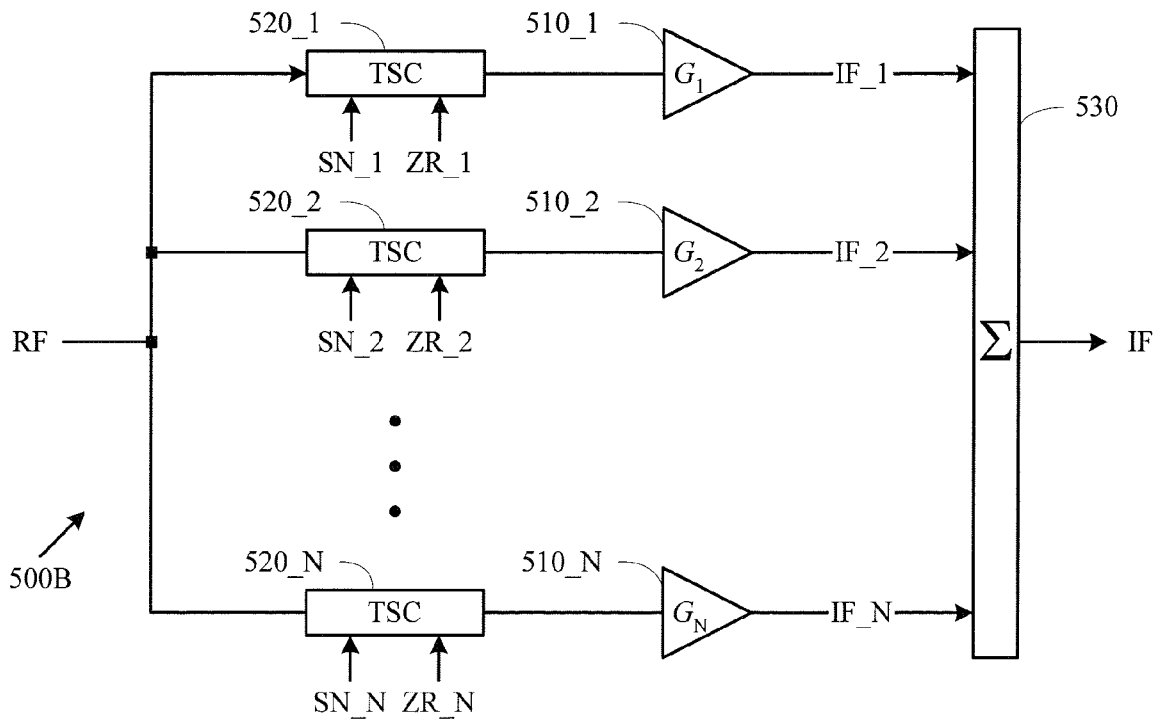
FIG. 5B shows an alternative embodiment of a frequency converter using a plurality of TSC circuits.
Figure 6:
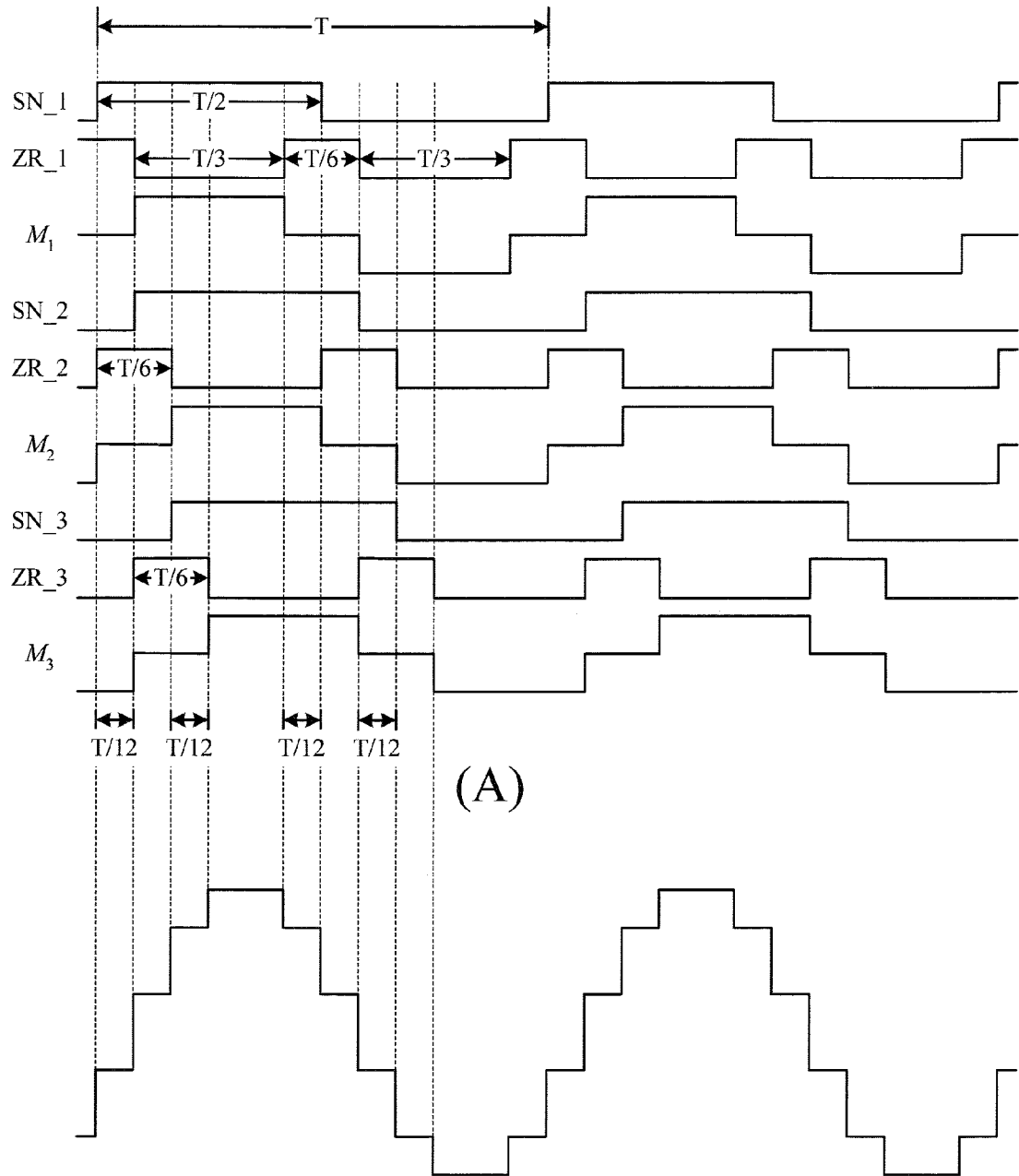
FIG. 6 shows a typical timing diagram of control signals and associated MLT-3 waves for the frequency converter of either FIG. 5A or FIG. 5B (A), and a composite waveform after a weighted sum (B).

Using a weighted sum of three such MLT-3 of proper timing offsets, one can construct a frequency converter capable of rejecting up to the $5^{th}$ harmonics. The frequency converter comprises three TSC circuits (please refer to FIG. 5A or FIG. 5B in the co-pending application for N=3); all three TSC circuits effectively implement a multiplication with a MLT-3 wave having a $T_1/T$ value of $\frac{1}{4}$ (and also a $T_{-1}/T=\frac{1}{4}$ and a $T_0/T=\frac{1}{8}$). Their respective MLT-3 waves have exactly the same frequency (1/T) but different phases. The timing of the first MLT-3 wave (corresponding to the first TSC circuit 520_1 of FIG. 5A or FIG. 5B of the co-pending application) is earlier than the timing of the second MLT-3 wave (corresponding to the second TSC circuit 520_2 of FIG. 5A or FIG. 5B of the co-pending application) by an amount of $\tau$. Also, the timing of the second MLT-3 wave is earlier than the timing of the third MLT-3 wave (corresponding to the third TSC circuit 520_N of FIG. 5A or FIG. 5B of the co-pending application for N=3) by an amount of $\tau$. Mathematically we may represent the three MLT-3 waves by $$M_1(t) = \frac{4\cos(\pi/4)}{\pi}\left(\sin(\omega t + \omega\tau) - \frac{1}{3}\cdot\sin(3\omega t + 3\omega\tau) - \frac{1}{5}\cdot\sin(5\omega t + 5\omega\tau) + \ldots\right)$$

$$M_2(t) = \frac{4\cos(\pi/4)}{\pi}\left(\sin(\omega t) - \frac{1}{3}\cdot\sin(3\omega t) - \frac{1}{5}\cdot\sin(5\omega t) + \ldots\right)$$

$$M_3(t) = \frac{4\cos(\pi/4)}{\pi}\left(\sin(\omega t - \omega\tau) - \frac{1}{3}\cdot\sin(3\omega t - 3\omega\tau) - \frac{1}{5}\cdot\sin(5\omega t - 5\omega\tau) + \ldots\right)$$

where $\omega=2\pi/T$. By choosing $\tau=T/8$, i.e. $\tau=\pi/(4\omega)$, $G_2=2\cdot\cos(\pi/4)\cdot G_1$, and $G_3=G_1$, one obtains a composite wave, through a superposition of the three MLT-3 waves. The composite wave can be represented by the following mathematical expression:

$$M(t) = G_1 M_1(t) + G_2 M_2(t) + G_3 M_3(t) = \frac{4\cos(\pi/4)G_1}{\pi}$$
$$\left(\sin\left(\omega t + \frac{\pi}{4}\right) - \frac{1}{3}\cdot\sin\left(3\omega t + \frac{3\pi}{4}\right) - \frac{1}{5}\cdot\sin\left(5\omega t + \frac{5\pi}{4}\right) + \ldots\right) -$$
$$\frac{8\cos^2(\pi/4)G_1}{\pi}\left(\sin(\omega t) - \frac{1}{3}\cdot\sin(3\omega t) - \frac{1}{5}\cdot\sin(5\omega t) + \ldots\right) +$$

$$\frac{4\cos(\pi/4)G_1}{\pi}$$

$$\left(\sin\left(\omega t - \frac{\pi}{4}\right) - \frac{1}{3} \cdot \sin\left(3\omega t - \frac{3\pi}{4}\right) - \frac{1}{5} \cdot \sin\left(5\omega t - \frac{5\pi}{4}\right) + \ldots\right) =$$

$$\frac{8G_1}{\pi}\sin(\omega t) + \text{(7th and higher order harmonics)}$$

Therefore, $3^{rd}$ order and $5^{th}$ order harmonics are both eliminated, and the composite wave is spurious free until the $7^{th}$ harmonics.

Figure 2:
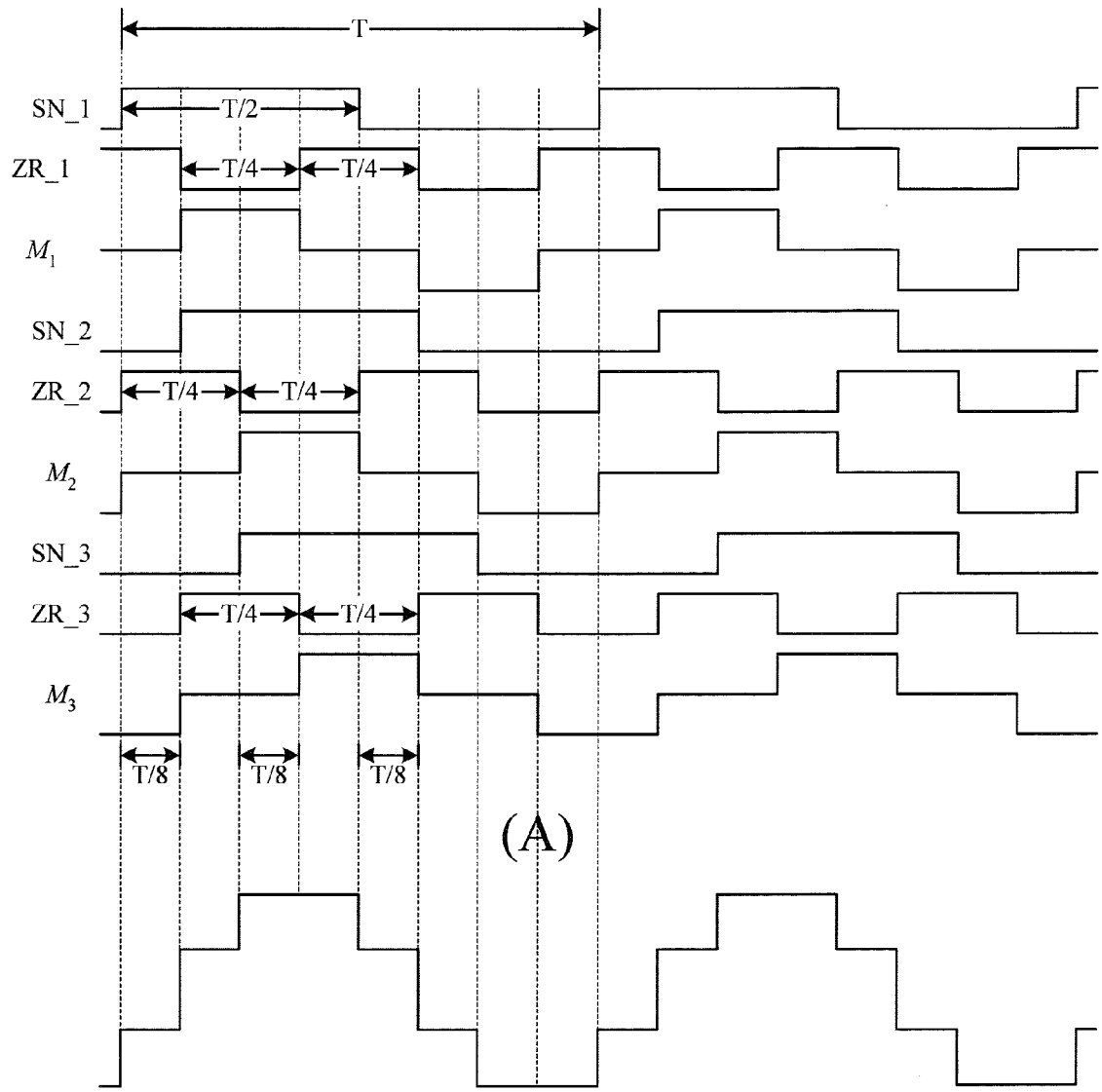
FIG. 2 shows a symbol (A) and an exemplary timing diagram (B) for a tri-state chopper (TSC) circuit.

An exemplary timing diagram for these three TSC circuits and their corresponding MLT-3 waves is shown in FIG. 2(A). All three "sign" controls (SN_1, SN_2, and SN_3) are square waves of period T with 50% duty cycle; however, their timings are spaced in a T/8 step, i.e. SN_2 has a delay of T/8 relative to SN_1, and SN_3 has a delay of T/8 relative to SN_2. All three "zero" controls (ZR_1, ZR_2, and ZR_3) are rectangular waves of period T/2 with 50% duty cycle; however, their timings are spaced in a T/8 step, i.e. ZR_2 has a delay of T/8 relative to ZR_1, and ZR_3 has a delay of T/8 relative to ZR_2. The respective MLT-3 waveforms for these three TSC circuits are depicted and labeled as $M_1$, $M_2$, $M_3$, respectively, as shown in FIG. 2(A). By scaling each MLT-3 signal with a respective gain and summing the scaled MLT-3 signals together, one can synthesize a waveform to approximate a sinusoidal wave, as shown in FIG. 2(B). Since the synthesized waveform is close to an ideal sinusoidal signal, the harmonics are greatly suppressed, compared to a square wave or a single MLT-3 wave. Note that the scaling is realized using a gain element associated with each TSC circuit; and the summing is realized using a summing circuit.

Figure 3:
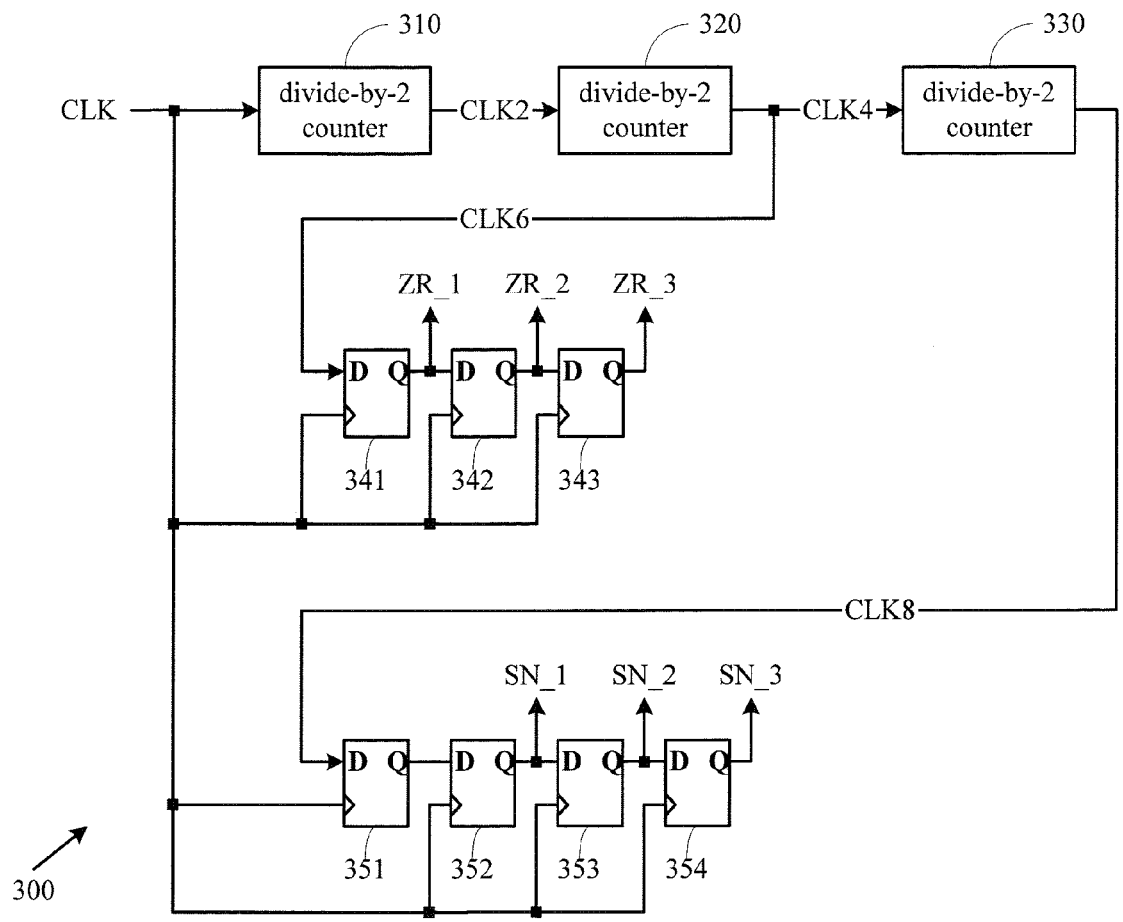
FIG. 3 shows an exemplary embodiment of a TSC circuit.
Figure 4:
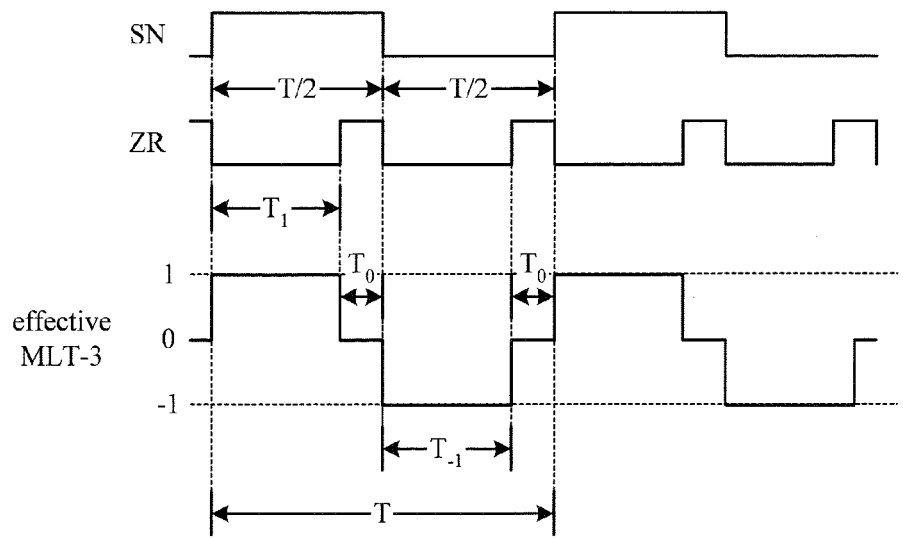
FIG. 4 shows an exemplary MLT-3 (multi-level transmit, 3-level) waveform implied in a TSC circuit.

FIG. 3 shows an exemplary embodiment for generating the control signals needed for implementing the three MLT-3 waves shown in FIG. 2(A). A first clock CLK of period T/8 must be provided, say from a phase-lock-loop (PLL) circuit. A second clock CLK2 of period T/4 is derived from the first clock CLK using a first divide-by-2 counter 310. A third clock CLK4 of period T/2 is derived from the second clock CLK2 using a second divide-by-2 counter 320. The duty cycle of CLK4 is ½, because CLK4 is generated from a divide-by-2 counter 320; the reason is well understood in prior art and thus not explained here. A fourth clock CLK8 of period T is generated from the third clock CLK4 using a third divide-by-2 counter 330. The duty cycle of CLK8 is ½, because CLK8 is generated from a divide-by-2 counter 330; the reason is well understood in prior art and thus not explained here. A first register array comprising DFF (data flip flop) 341, 342, and 343 is used to sample the third CLK4 at a rising edge of the first clock CLK, resulting in three "zero" signals, ZR_1, ZR_2, and ZR_3. As a result, the three "zero" signals have the same period of T/2 and the same duty cycle of ½ but have timings spaced in a step of T/8. A second register array comprising DFF (data flip flop) 351, 352, 353, and 354 is used to sample the fourth CLK8 at a rising edge of the first clock CLK, resulting in three "sign" signals, SN_1, SN_2, and SN_3. As a result, the three "sign" signals have the same period of T and the same duty cycle of ½ but have timings spaced in a step of T/8. Note that there is one more DFF (351) inserted in the second register array, therefore, the three "sign" signals have an extra delay of T/8 compared to the three "zero" signals. The detailed circuit embodiments of a data flip-flop, and a divide-by-2 counter are well know to those of ordinary skill in the art and thus are not described here.

Tri-State Chopper Based Direct Conversion Receiver

Figure 8:
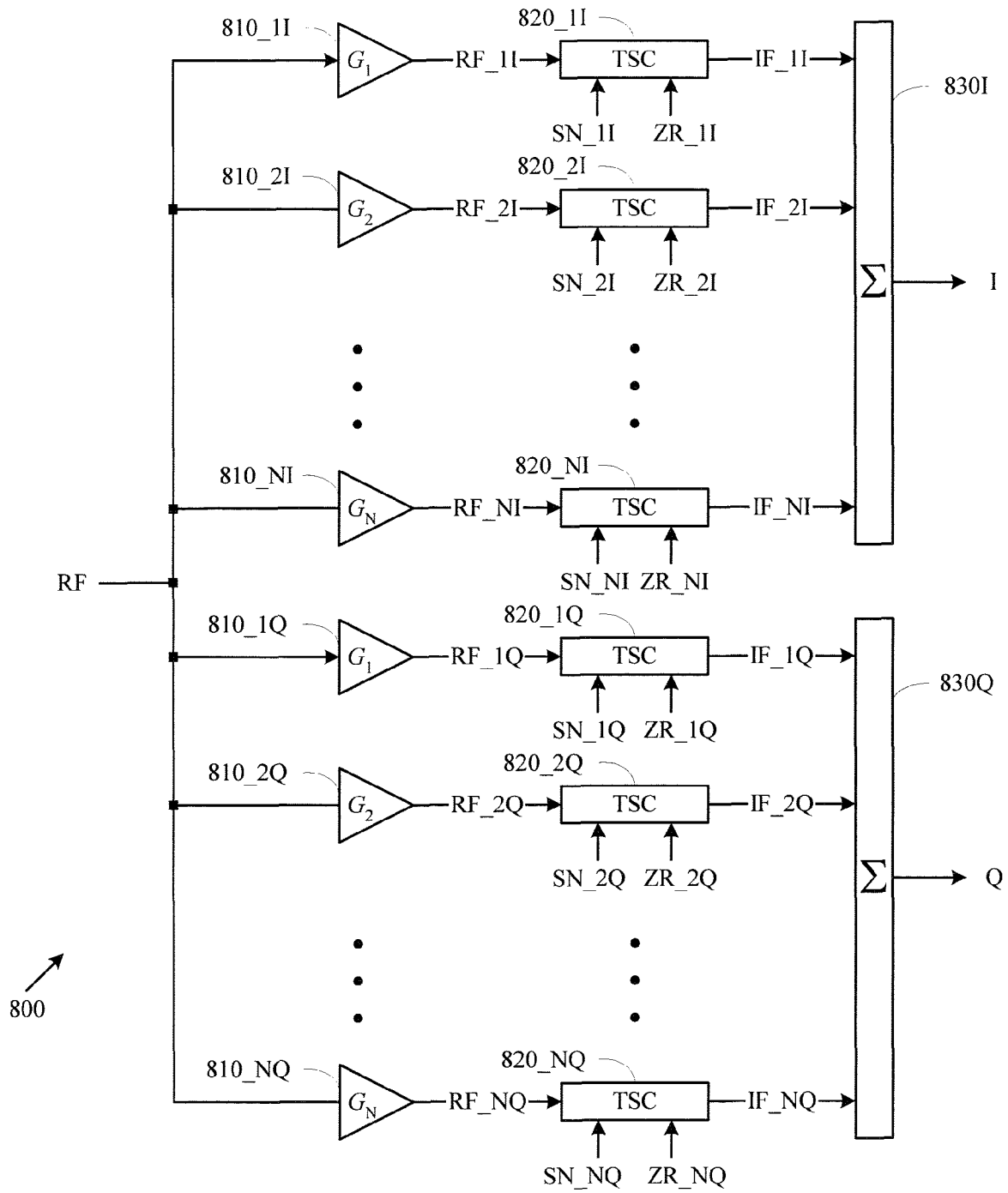
FIG. 8 shows an embodiment of a quadrature frequency converter using two groups of TSC circuits.

In a direct conversion receiver, a quadrature frequency converter comprising an in-phase (I) conversion path and a quadrature (Q) conversion path is needed. The principle of TSC based frequency conversion disclosed above can be easily extended to quadrature frequency conversion. A quadrature frequency converter using a plurality of TSC circuits is illustrated in FIG. 8. Here, an input signal RF is converted into an in-phase signal I using an in-phase conversion path and into a quadrature output signal Q using a quadrature conversion path. The in-phase conversion path comprises a first group of gain elements (810_1I, 810_2I, and so on), a first group of TSC circuits (820_1I, 820_2I, and so on) using a first group of control signals (SN_1I, ZR_1I, SN_2I, ZR_2I, and so on), and a first summing element 830I. The quadrature conversion path comprises a second group of gain elements (810_1Q, 810_2Q, and so on), a second group of TSC circuits (820_1Q, 820_2Q, and so on) using a second group of control signals (SN_1Q, ZR_1Q, SN_2Q, ZR_2Q, and so on), and a second summing element 830Q. All "sign" signals (SN_1I, SN_1Q, SN_2I, SN_2Q, and so on) must be periodic with the same period (say T). All "zero" signals (ZR_1I, ZR_1Q, ZR_2I, ZR_2Q, and so on) must also be periodic with the same period (say T/2). The quadrature conversion path has substantially the same circuit as the in-phase conversion path. The control signals for the quadrature conversion path (i.e. SN_1Q, ZR_1Q, SN_2Q, ZR_2Q, and so on) also have substantially the same waveforms as their respective counterparts in the in-phase conversion path (i.e. SN_1I, ZR_1I, SN_2I, ZR_2I, and so on); however, they must have a constant timing offset of approximately T/4 relative to their respective counterparts in the in-phase conversion path. For instance, SN_1Q has the same waveform as SN_1I but has a constant timing offset of T/4 relative to SN_1I, and ZR_1Q has the same waveform as ZR_1I but has a constant timing offset of T/4 relative to ZR_1I. In this manner, each TSC circuit effectively performs a MLT-3 multiplication, where the MLT-3 wave for any TSC circuit in the quadrature conversion path has a timing offset of T/4 relative to its counterpart in the in-phase conversion path.

Figure 7:
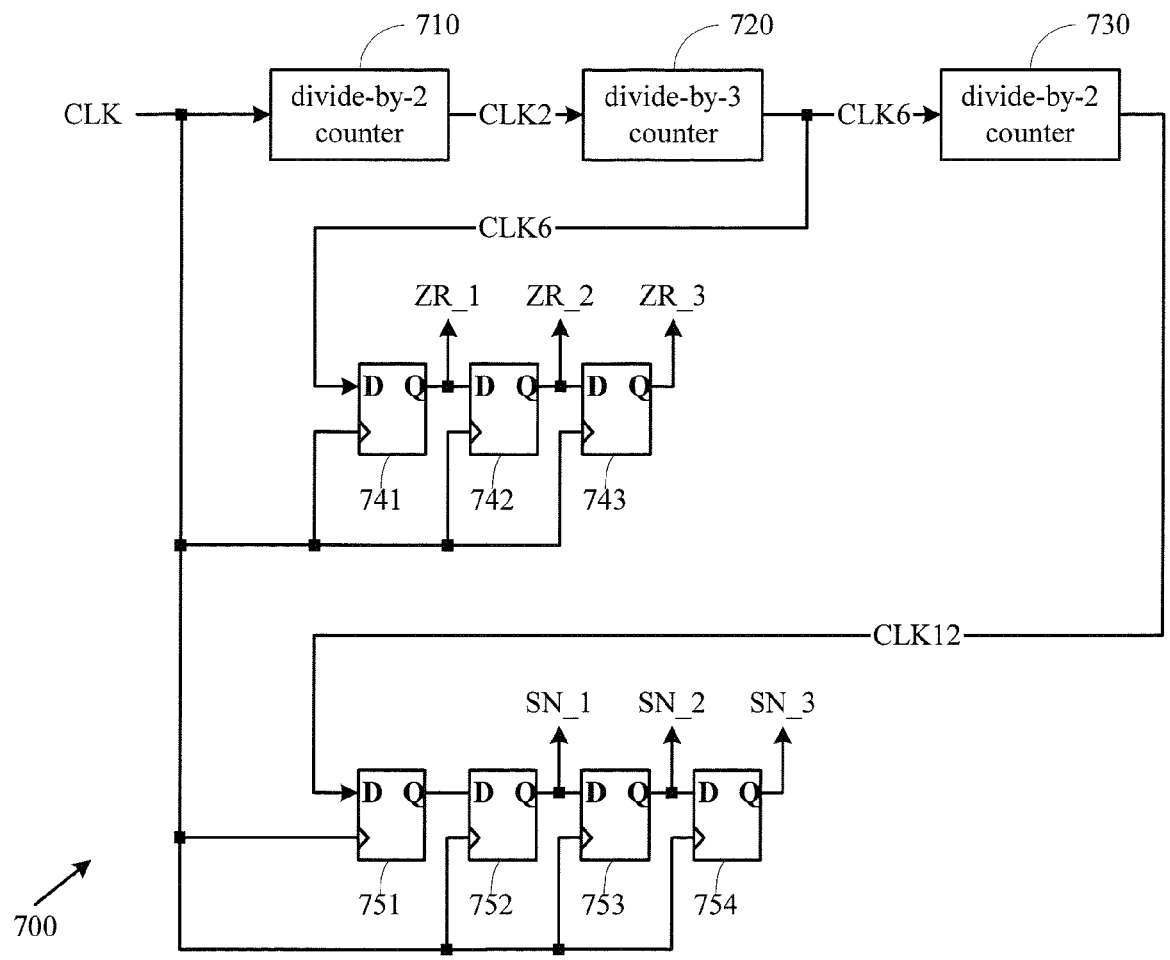
FIG. 7 shows an embodiment for generating the control signals shown in FIG. 6.
Figure 9:
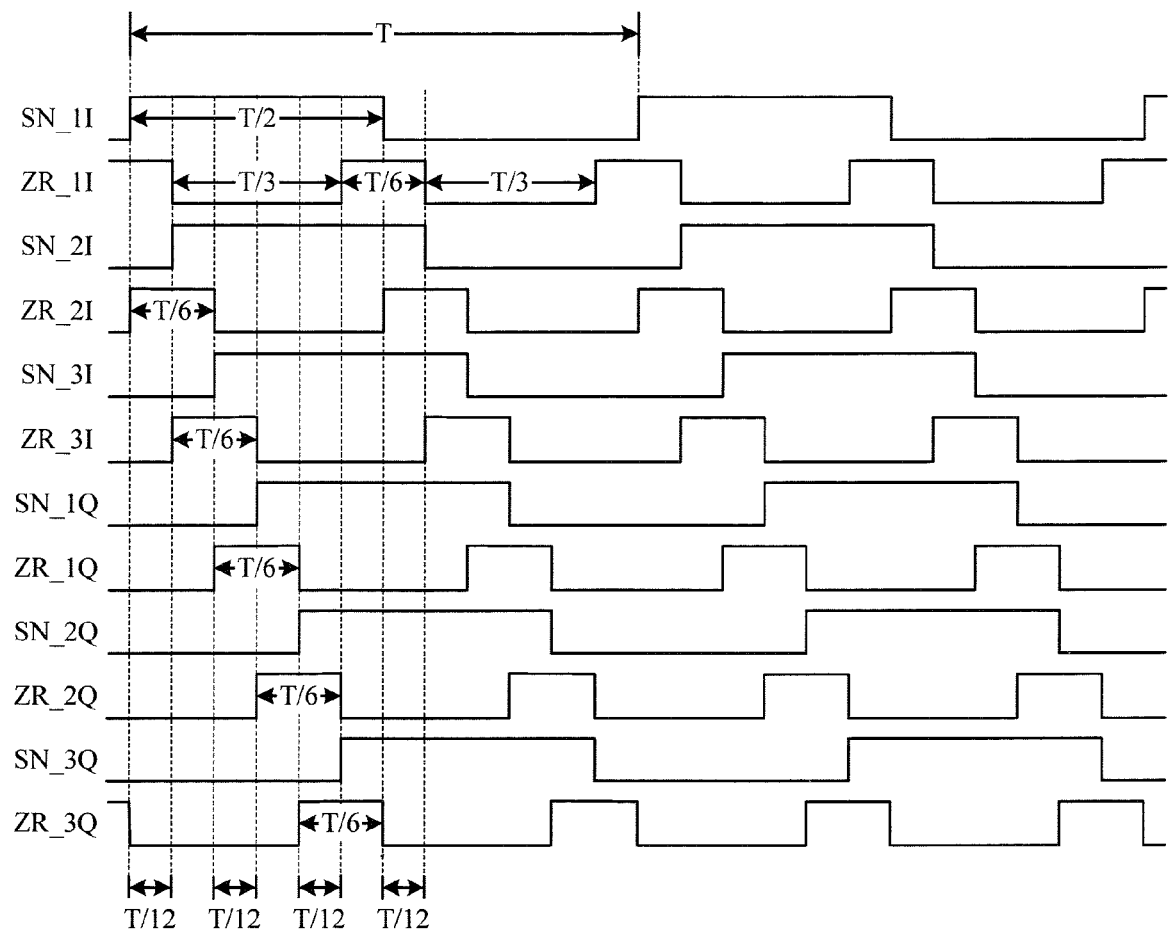
FIG. 9 shows a typical timing diagram of control signals for the quadrature frequency converter of FIG. 8.
Figure 10:
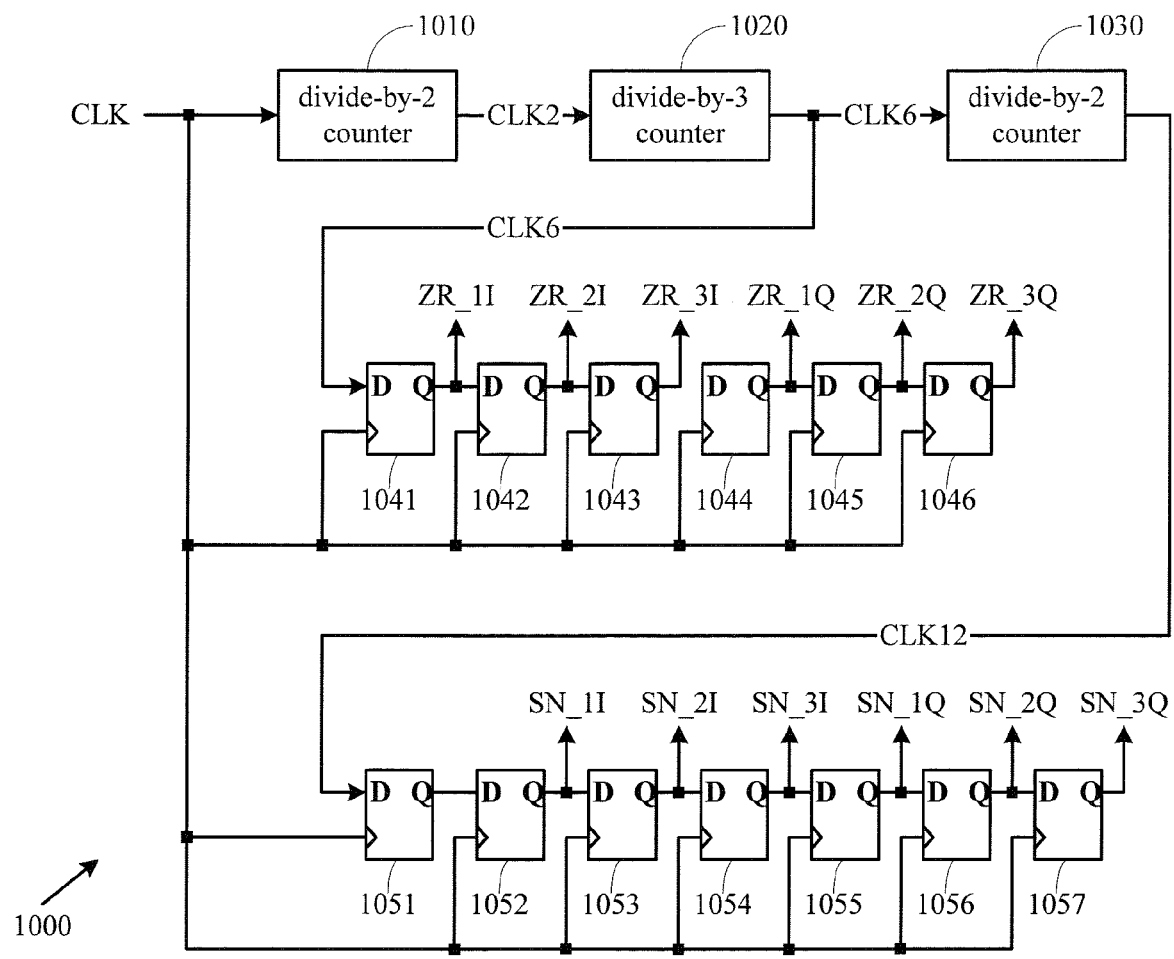
FIG. 10 shows an embodiment for generating the control signals shown in FIG. 9.

Again, a design of particular interest is to use three TSC circuits for each of both conversion paths and to use the same MLT-3 waveform that has $T_1/T = T_{-1}/T = \frac{1}{3}$ and $T_0/T = \frac{1}{6}$ for all TSC circuits. An exemplary timing diagram for such a scenario is depicted in FIG. 9. Here, all "sign" signals have the same period of T and the same duty cycle of ½, and all "zero" signals have the same period of T/2 and the same duty cycle of ⅓. SN_2I, SN_3I, SN_1Q, SN_2Q, and SN_3Q have a constant timing offset of T/12 relative to SN_1I, SN_2I, SN_3I, SN_1Q, and SN_2Q, respectively; and ZR_2I, ZR_3I, ZR_1Q, ZR_2Q, and ZR_3Q have a constant timing offset of T/12 relative to ZR_1I, ZR_2I, ZR_3I, ZR_1Q, and ZR_2Q, respectively. An exemplary circuit embodiment for generating those control signals is shown in FIG. 10, which is the same as that in FIG. 7 except for the following changes: three extra DFF (1044-1046) are added in the "zero" register array for generating the three "zero" control signals for the quadrature conversion path (i.e. ZR_1Q, ZR_2Q, and ZR_3Q), and also three extra DFF (1055-1057) are added in the "sign" register array for generating the three "sign" control signals for the quadrature conversion path (i.e. SN_1Q, SN_2Q, and SN_3Q). It is clear that, every control signal in the quadrature path has a timing delay of T/4 (which is the delay caused by three DFF stages when the period of CLK is T/12) relative its counter part in the in-phase path. For instance, ZR_1Q has a delay of T/4 relative to ZR_1I, and SN_1Q has a delay of T/4 relative to SN_11.

Figure 11:
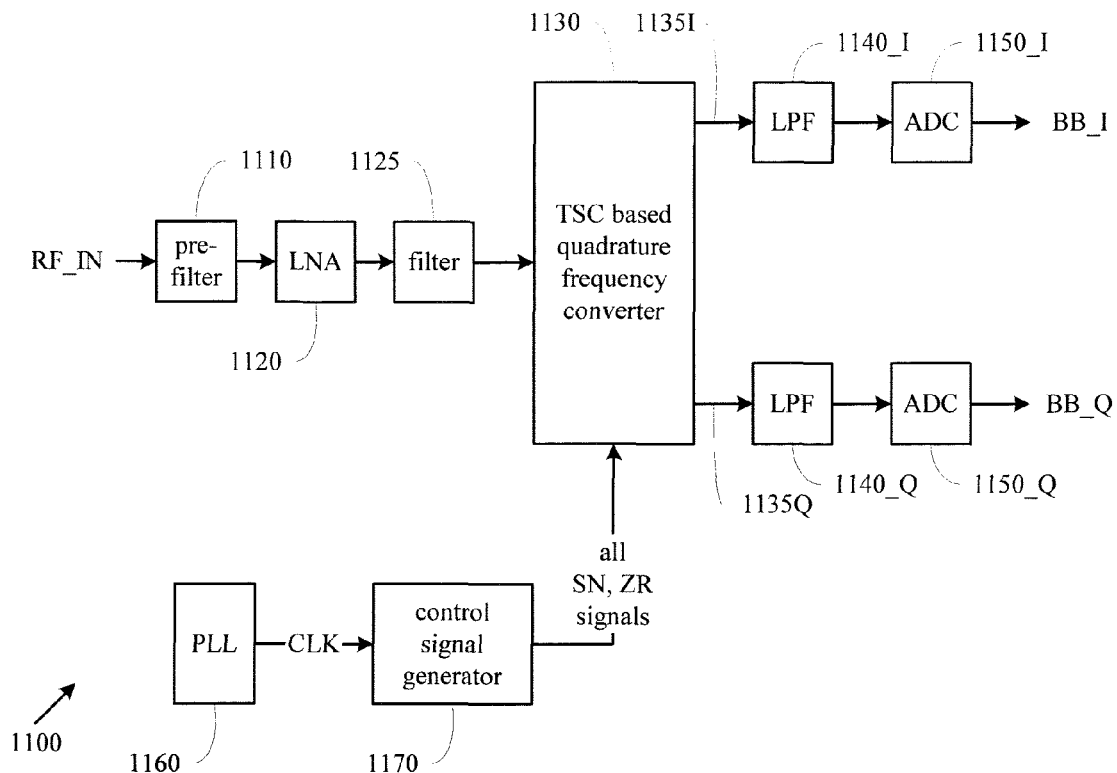
FIG. 11 shows a direct conversion receiver using a TSC based quadrature frequency converter.

A direct conversion receiver using a TSC based quadrature frequency converter is illustrated in FIG. 11. Here, receiver 1100 comprises an optional pre-filter 1110, a LNA (low noise amplifier) 1120, an optional filter 1125, a TSC based quadrature frequency converter 1130, an in-phase path comprising a first LPF (low pass filter) 1140_I and a first ADC (analog-digital converter) 1150_I, a quadrature path comprising a second LPF 1140_Q and a second ADC 1150_Q, a PLL (phase lock loop) 1160, and a control signal generator 1170. An input signal RF_IN, received from for example an antenna, is filtered by the optional pre-filter 1110, then amplified by LNA 1120, then filtered by the optional filter 1125, and then converted into two signals 1135I and 1135Q using TSC based quadrature frequency converter 1130. The signal 1135I is filtered by LPF 1140_I and digitized into a first output signal BB_I using ADC 1150_I, while the signal 1135Q is filtered by LPF 1140_Q and digitized into a second output signal BB_Q using ADC 1150_Q. PLL 1160 is used to generate a clock signal CLK, whose frequency is for example 12 times as high as the frequency of the desired RF signal to be converted. The CLK signal is provided to control signal generator 1170 to generate a plurality of "sign" control signals (SN) and a plurality of "zero" control signals (ZR), for example using the circuit shown in FIG. 10. These SN and ZR signals are provided to the TSC based quadrature frequency converter 1130, which is embodied for example using the circuit shown in FIG. 8.

Figure 12A:
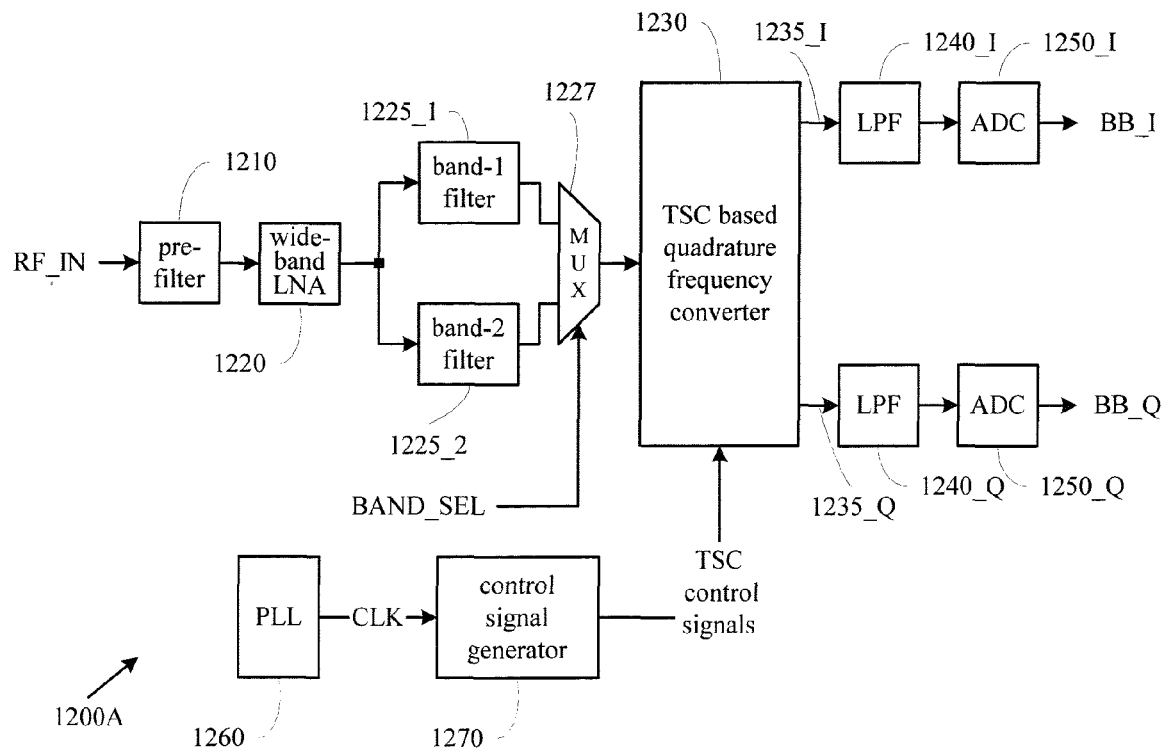
FIG. 12A shows a multi-band direct conversion receiver using a TSC based quadrature frequency converter.

TV tuners usually need to receive the content of a certain channel among a wide-band, multi-band RF signals. FIG. 12A depicts an exemplary embodiment of a multi-band TV tuner 1200A employing TSC based frequency conversion. Multi-band tuner 1200A comprises: a pre-filter 1210 for filtering a wide-band signal RF_IN; a wide-band LNA 1220 for amplifying an output of the pre-filter 1210; a first filter 1225_1 for performing a band selection for a first band, say band-1, on an output of the wide-band LNA 1220; a second filter 1225_2 for performing a band selection for a second band, say band-2, on the output of the wide-band LNA 1220; a multiplexer 1227 controlled by a band selection signal BAND_SEL for generating an output by selecting between an output of the first filter 1225_1 and an output of the second filter 1225_2; a TSC based quadrature frequency converter 1230 for converting the output of the multiplexer 1227 into an in-phase signal 1235_I and a quadrature signal 1235_Q using TSC control signals (e.g. SN and ZR); an in-phase path comprising LPF 1240_I and ADC 1250_I for generating a baseband signal BB_I by processing the in-phase signal 1235_I; a quadrature path comprising LPF 1240_Q and ADC 1250_Q for generating a baseband signal BB_Q by processing the quadrature signal 1235_Q; a phase lock loop PLL 1260 for generating a clock signal CLK; and a control signal generator for generating the TSC control signals. This embodiment can be extended into more than two bands. In this embodiment, a plurality of filters and a multiplexer is employed to select a band out of a plurality of bands.

Figure 12B:
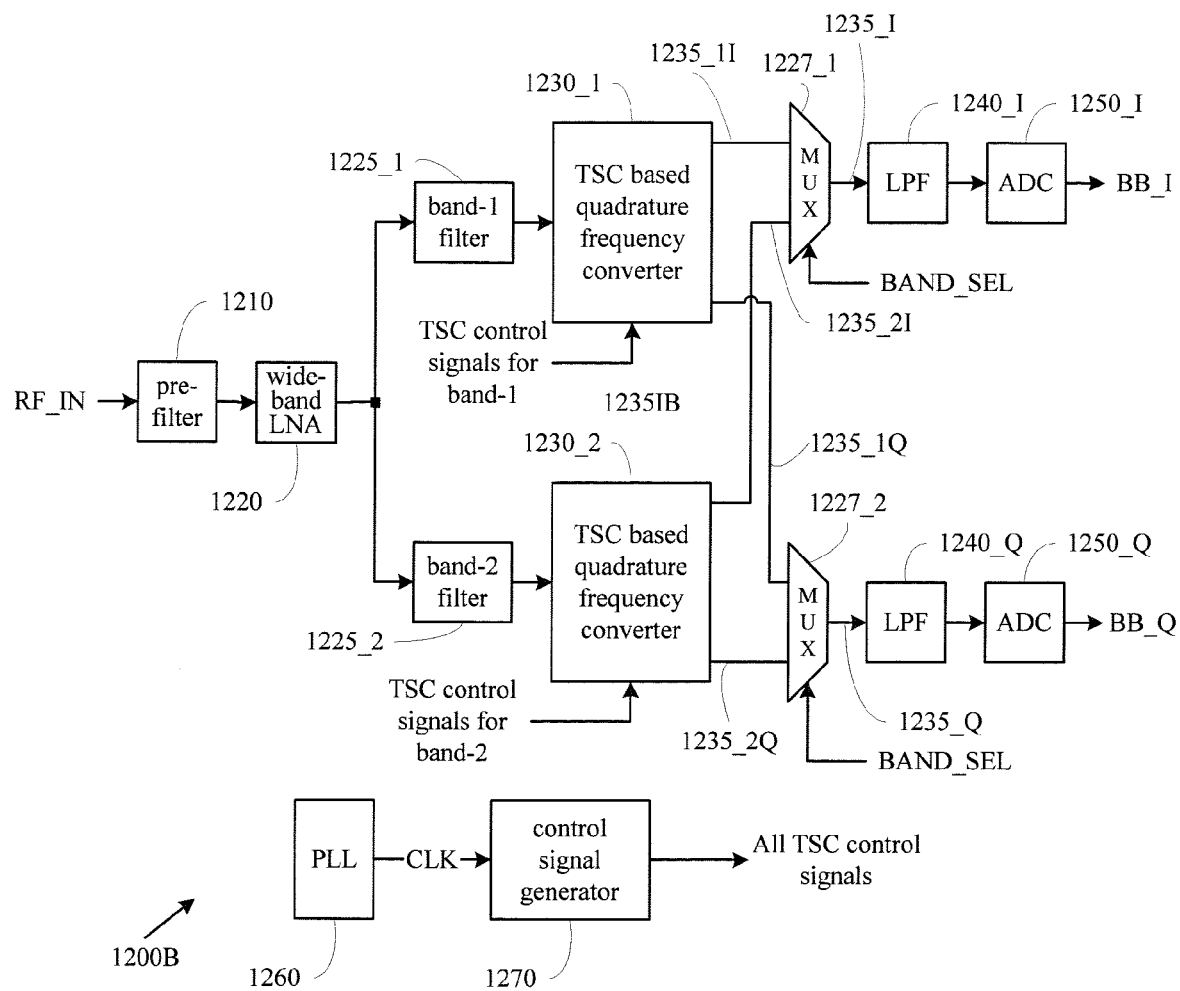
FIG. 12B shows an alternative multi-band direct conversion receiver using a plurality of TSC based quadrature frequency converters.

FIG. 12B depicts an alternative exemplary embodiment of a multi-band TV tuner 1200B employing TSC based frequency conversion. Multi-band tuner 1200B comprises: a pre-filter 1210 for filtering a wide-band signal RF_IN; a wide-band LNA 1220 for amplifying an output of the pre-filter 1210; a first filter 1225_1 for performing a band selection for a first band, say band-1, on an output of the wide-band LNA 1220; a second filter 1225_2 for performing a band selection for a second band, say band-2, on the output of the wide-band LNA 1220; a first TSC based quadrature frequency converter 1230_1 for converting an output of the first filter 1225_1 into a first in-phase signal 1235_1I and a first quadrature signal 1235_1Q using TSC control signals for band-1; a second TSC based quadrature frequency converter 1230_2 for converting an output of the second filter 1225_2 into a second in-phase signal 1235_2I and a second quadrature signal 1235_2Q using TSC control signals for band-2; a first multiplexer 1227_1 controlled by a band selection signal BAND_SEL for generating an in-phase signal 1235_I by selecting between in-phase signals 1235_1I and 1235_2I; a second multiplexer 1227_2 controlled by the band selection signal BAND_SEL for generating a quadrature signal 1235_Q by selecting between quadrature signals 1235_1Q and 1235_2Q; an in-phase path comprising LPF 1240_I and ADC 1250_I for generating a baseband signal BB_I by processing the in-phase signal 1235_I; a quadrature path comprising LPF 1240_Q and ADC 1250_Q for generating a baseband signal BB_Q by processing the quadrature signal 1235_Q; a phase lock loop PLL 1260 for generating a clock signal CLK; and a control signal generator for generating the TSC control signals for band-1 and band-2. This embodiment can be extended into more than two bands. This embodiment uses a respective TSC based quadrature frequency converter for each band-selecting filter output. This embodiment uses a plurality of TSC based quadrature frequency converters; each TSC based frequency converter can be optimized for a particular frequency band.

Figure 13:
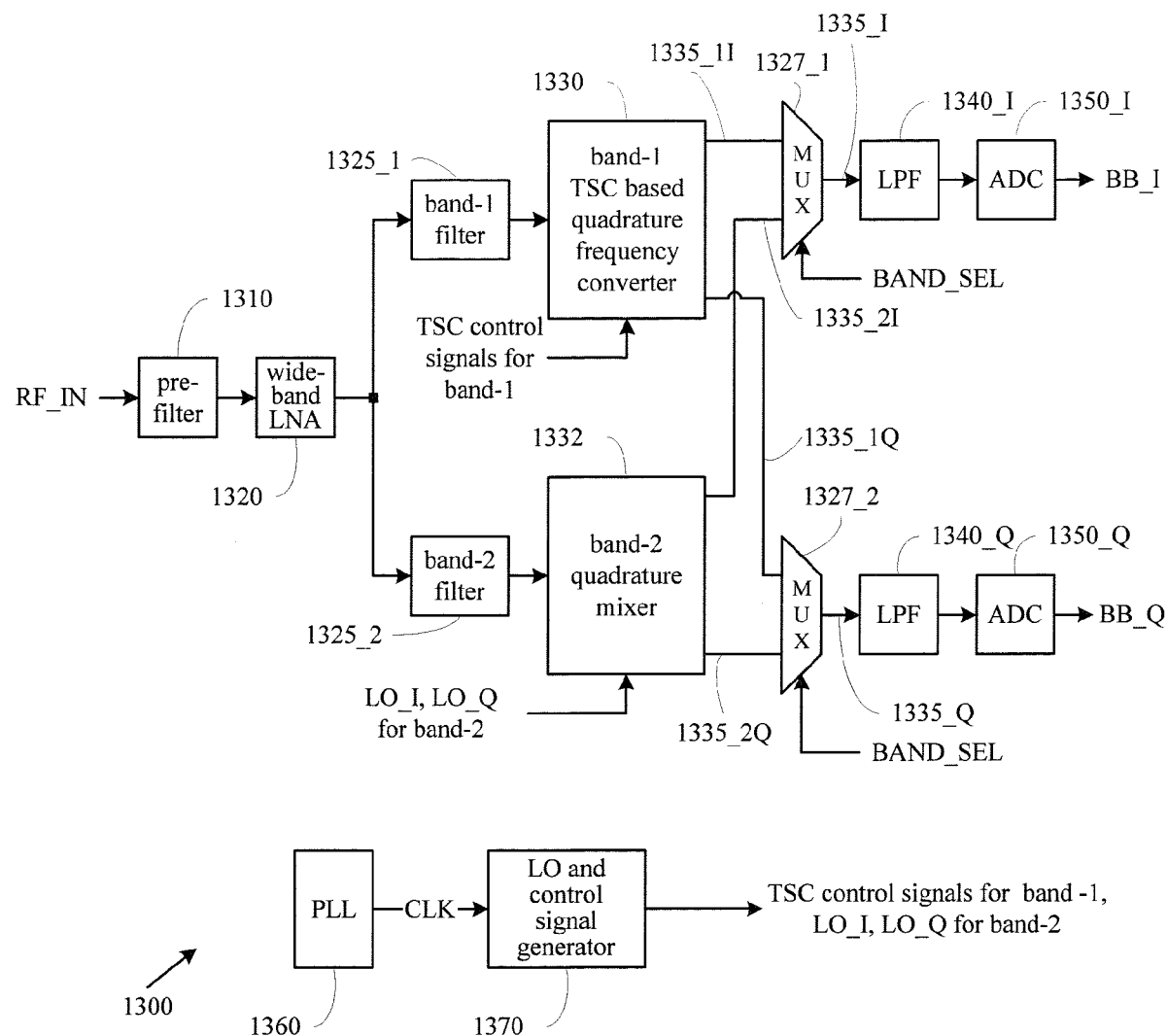
FIG. 13 shows

FIG. 13 depicts another embodiment of a multi-band TV tuner 1300 employing TSC based frequency conversion. Multi-band tuner 1300 comprises: a pre-filter 1310 for filtering a wide-band signal RF_IN; a wide-band LNA 1320 for amplifying an output of the pre-filter 1310; a first filter 1325_1 for performing a band selection for a first band, say band-1, on an output of the wide-band LNA 1320; a second filter 1325_2 for performing a band selection for a second band, say band-2, on the output of the wide-band LNA 1320; a TSC based quadrature frequency converter 1330 for converting an output of the first filter 1325_1 into a first in-phase signal 1335_1I and a first quadrature signal 1335_1Q using TSC control signals for band-1; a quadrature mixer 1332 for converting an output of the second filter 1325_2 into a second in-phase signal 1335_2I and a second quadrature signal 1335_2Q using quadrature LO signals LO_I and LO_Q for band-2; a first multiplexer 1327_1 controlled by a band selection signal BAND_SEL for generating an in-phase signal 1335_I by selecting between in-phase signals 1335_1I and 1335_2I; a second multiplexer 1327_2 controlled by the band selection signal BAND_SEL for generating a quadrature signal 1335_Q by selecting between quadrature signals 1335_1Q and 1335_2Q; an in-phase path comprising LPF 1340_I and ADC 1350_I for generating a baseband signal BB_I by processing the in-phase signal 1335_I; a quadrature path comprising LPF 1340_Q and ADC 1350_Q for generating a baseband signal BB_Q by processing the quadrature signal 1335_Q; a phase lock loop PLL 1360 for generating a clock signal CLK; and a control signal generator for generating the LO signals LO_I and LO_Q for band-2 and the TSC control signals for band-1. This embodiment can be extended into more than two bands: at least one of the bands is down-converted to baseband using a conventional quadrature mixer, and at least one of the bands is down-converted to baseband using a TSC based quadrature frequency converter. In this embodiment, band-2 employs a conventional quadrature mixer instead of the TSC based quadrature frequency converter; such arrangement is useful if band-2 does not have a serious harmonics rejection problem due to effective pre-filtering or band filtering.

Figure 14:
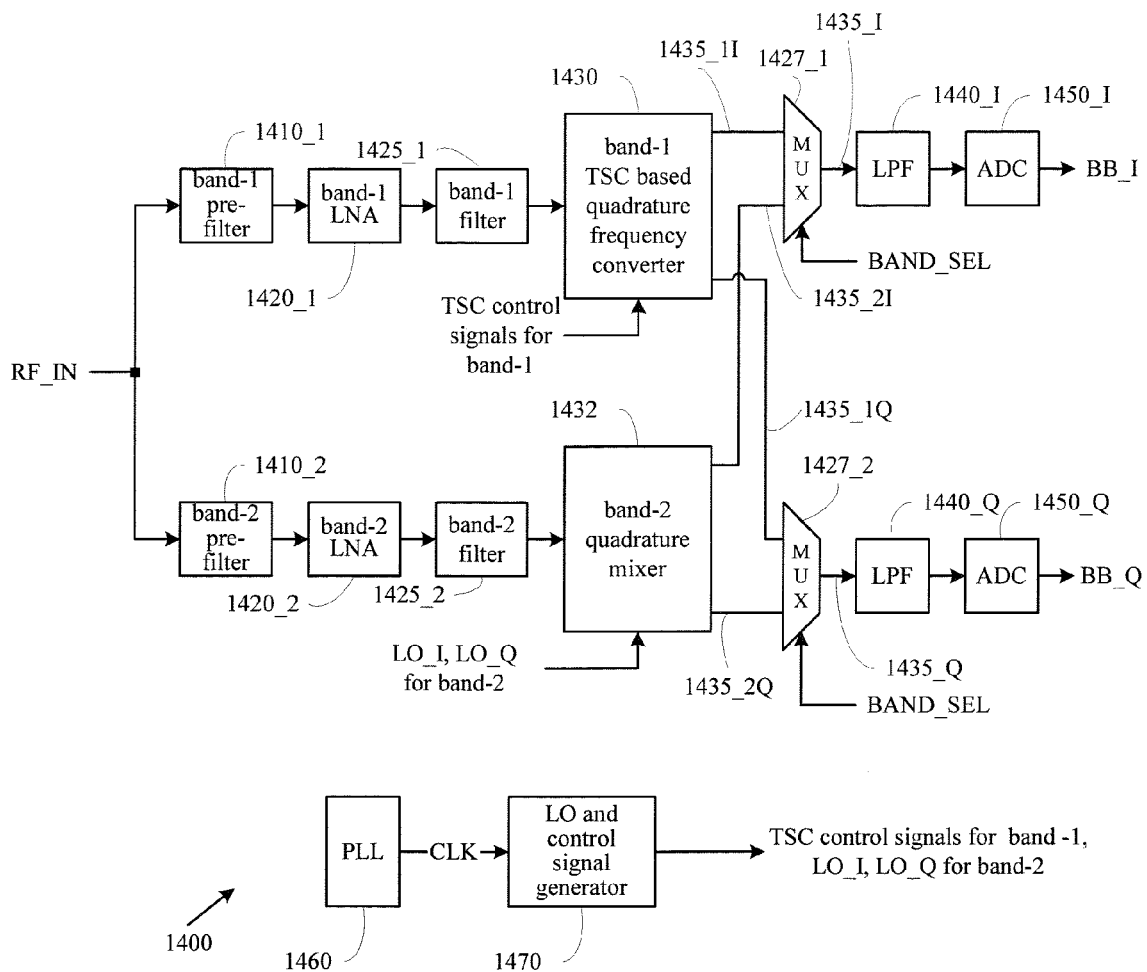
FIG. 14 shows

FIG. 14 depicts another embodiment of a multi-band TV tuner 1400 employing TSC based frequency conversion.

Multi-band tuner 1400 comprises: a first pre-filter 1410_1 for filtering a wide-band signal RF_IN; a first LNA 1420_1 for amplifying an output of the pre-filter 1410_1; a first filter 1425_1 for performing a band selection for a first band, say band-1, on an output of the LNA 1420_1; a TSC based quadrature frequency converter 1430 for converting an output of the first filter 1425_1 into a first in-phase signal 1435_1I and a first quadrature signal 1435_1Q using TSC control signals for band-1; a second pre-filter 1410_2 for filtering the wide-band signal RF_IN; a second LNA 1420_2 for amplifying an output of the pre-filter 1410_2; a second filter 1425_2 for performing a band selection for a second band, say band-2, on the output of the LNA 1420_2; a quadrature mixer 1432 for converting an output of the second filter 1425_2 into a second in-phase signal 1435_2I and a second quadrature signal 1435_2Q using quadrature LO signals LO_I and LO_Q for band-2; a first multiplexer 1427_1 controlled by a band selection signal BAND_SEL for generating an in-phase signal 1435_I by selecting between in-phase signals 1435_1I and 1435_2I; a second multiplexer 1427_2 controlled by the band selection signal BAND_SEL for generating a quadrature signal 1435_Q by selecting between quadrature signals 1435_1Q and 1435_2Q; an in-phase path comprising LPF 1440_I and ADC 1450_I for generating a baseband signal BB_I by processing the in-phase signal 1435_I; a quadrature path comprising LPF 1440_Q and ADC 1450_Q for generating a baseband signal BB_Q by processing the quadrature signal 1435_Q; a phase lock loop PLL 1460 for generating a clock signal CLK; and a control signal generator for generating the LO signals LO_I and LO_Q for band-2 and the TSC control signals for band-1. This embodiment can be extended into more than two bands: at least one of the bands is down-converted to baseband using a conventional quadrature mixer, and at least one of the bands is down-converted to baseband using a TSC based quadrature frequency converter. In an alternative embodiment not shown in figure, pre-filter 1410_1 and pre-filter 1410_2 do not receive a common RF signal; instead, they receive separate RF signals.

In embodiments 1200B of FIG. 12B, 1300 of FIG. 13, and 1400 of FIG. 14, there is only one in-phase path (quadrature) path, and one in-phase (quadrature) multiplexer is used to select an in-phase (quadrature) baseband signal from a plurality of in-phase (quadrature) baseband signals generated from either a conventional mixer or a TSC based frequency converter. It should be understood that one can choose to remove the in-phase (quadrature) multiplexer. If so, one needs to have more than one in-phase (quadrature) paths; each band needs to have a respective in-phase (quadrature) path.

In an embodiment, according to a state of the band select signal BAND_SEL, some of the circuits that are irrelevant to the current band of interest are powered off to save the power. In FIG. 14, for example, when BAND_SEL indicates that band-1 is currently selected, the band-2 LNA 1425_2 and band-2 quadrature mixer 1452 are powered off.

In embodiments 1200B of FIG. 12B, 1300 of FIG. 13, and 1400 of FIG. 14, only one PLL (phase lock loop) circuit is shown. It should be understood that, for a wide-band application, one may employ more than one phase lock loop circuits to cover a wide range of frequencies needed for performing the frequency conversion. The LO and control signal generator (1370 of FIGS. 13 and 1470 of FIG. 14) comprises a plurality of flip flops and dividers (e.g. see FIG. 10).

ALTERNATIVE EMBODIMENTS

The principle disclosed by the current invention can be practiced in various forms. For example:

1. A gain element accompanying an associated TSC circuit (within a frequency conversion path) for effectively scaling an effective MLT-3 multiplication implied by the TSC circuit can be placed either before the TSC circuit or after the TSC circuit. For instance, gain stage 810_1I is placed before TSC 820_1I in FIG. 8, but can also be alternatively placed after TSC 820_1I. Although not absolutely necessary, it is highly desirable that the rest of the gain elements in FIG. 8 are also placed after their respective TSC circuits if gain element 810_1I is placed after TSC 820_1I (i.e., gain element 810_2I is placed after TSC 820_2I, gain element 810_1Q is placed after TSC 820_1Q, and so on) so that all parallel paths match well.
2. A gain element accompanying an associated TSC circuit (within a frequency conversion path) for effectively scaling an effective MLT-3 multiplication implied by the TSC circuit can be implemented using either a current-mode device (e.g. trans-conductance amplifier) or a voltage-mode device (e.g. operational amplifier).
3. A summing circuit for summing up all outputs from a plurality of TSC-based conversion paths can be implemented using either: (1) a direct tying of all outputs when all gain elements within said TSC-based conversion paths are implemented using current-mode devices, or (2) an operational amplifier when all gain elements within said TSC-based conversion paths are implemented using voltage-mode devices.
4. Instead of using a plurality of analog gain elements for implementing a plurality of "scaling" functions and an analog summing circuit for summing outputs from a plurality of conversion paths, one may choose to implement both the "scaling" and the "summing" function in a digital domain. In the digital domain embodiment: no analog gain elements are needed; an input RF signal is converted into a plurality of conversion signals by a plurality of TSC circuits, respectively; said conversion signals are filtered by a plurality of low pass filters, respectively; outputs from said low pass filters are digitized into a plurality of digital words by a plurality of analog-digital converters; said digital words are scaled by a plurality of digital gain elements, respectively, and summed together to generate a final output. Now refer to FIG. 11. When the "scaling" and the "summing" functions within the TSC-based quadrature frequency converter 1130 are implemented in the digital domain, signals 1135I and 1135Q are readily the final digitized baseband outputs, and therefore LPF 1140_I and 1140_Q and ADC 1150_I and 1150_Q must be removed.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:
1. A receiver for receiving an RF (radio frequency) signal, the receiver including comprising:
a plurality of RF paths for processing the RF signal and for generating a plurality of processed RF signals, respectively;
a TSC (tri-state chopper) based quadrature frequency converter disposed to receive one of said processed RF signals and convert the received processed RF signals into a in-phase baseband signal and a quadrature baseband signal;

wherein the quadrature frequency converter operates in accordance with a first set of periodic three-state control signals and a second set of periodic three-state control signals that are approximately 90 degrees offset from the first set of periodic control signals.

2. The receiver of claim 1, further comprising:

a control signal generator, which comprises a plurality of flip flops and dividers, for generating the first set and the second set of periodic control signals.

3. The receiver of claim 2, further comprising:

a phase lock loop, coupled to the control signal generator, for generating a clock signal to the control signal generator.

4. The receiver of claim 1, further comprising:

a multiplexer coupled to the quadrature frequency converter, wherein the multiplexer is controlled by a band selection signal.

5. A method for receiving a RF (radio frequency) signal, the method comprising:

processing the RF signal using a plurality of RF processing paths of distinct frequency responses to generate a plurality of processed RF signals;

inputting a selected one of the processed RF signal into a TSC (tri-state chopper) based Quadrature frequency converter;

converting the selected processed RF signal into an in-phase baseband signal and a quadrature baseband signal using the TSC based quadrature frequency converter;

wherein the quadrature frequency converter performs the converting using a set of periodic in-phase three-state control signals and a set of periodic quadrature three-state control signals that are approximately 90 degrees offset from the set of periodic in-phase control signals.

6. The method of claim 5, further comprising:

providing a control signal generator to generate the first set and the second set of periodic control signals, wherein the control signal generator comprising a plurality of flip flops and dividers.

7. A method for receiving a RF (radio frequency) signal, the method comprising:

processing the RF signal using a plurality of RF processing paths of distinct frequency responses to generate a plurality of processed RF signals;

converting the processed RF signal of a first path into an in-phase baseband signal and a quadrature baseband signal using a quadrature mixer;

converting the processed RF signal of a second path into an in-phase baseband signal and a quadrature baseband signal using a TSC (tri-state chopper) based quadrature frequency converter; and selecting between either the quadrature frequency converter based converted RF signal or the TSC based converted RF signal for output;

wherein the TSC based quadrature frequency converter performs the converting using a set of periodic in-phase control signals and a set of periodic quadrature control signals that are approximately 90 degrees offset from the set of periodic in-phase three-state control signals.

8. The method of claim 7, wherein the first set and the second set of periodic control signals are three-state control signals.

9. The method of claim 7, further comprising:

providing a control signal generator to generate the first set and the second set of periodic control signals, wherein the control signal generator comprising a plurality of flip flops and dividers.

10. The method of claim 7, wherein the selecting operation comprises using the same signal to control a select input of two multiplexers, wherein each of the two multiplexers has an input coupled to an output of the quadrature based mixer and an input coupled to an output of the TSC based frequency converter.

* * * * *